(12) United States Patent
Noguchi et al.

(10) Patent No.: US 7,732,869 B2
(45) Date of Patent: Jun. 8, 2010

(54) INSULATED-GATE SEMICONDUCTOR DEVICE

(75) Inventors: Yasunari Noguchi, Gunma (JP); Eio Onodera, Gunma (JP); Hiroyasu Ishida, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 75 days.

(21) Appl. No.: 11/860,689

(22) Filed: Sep. 25, 2007

(65) Prior Publication Data
US 2008/0079079 A1    Apr. 3, 2008

(30) Foreign Application Priority Data
Sep. 28, 2006   (JP) .............................. 2006-265386

(51) Int. Cl.
    H01L 23/62  (2006.01)
(52) U.S. Cl. ............... 257/355; 257/328; 257/E29.328; 257/E21.351; 257/E21.361
(58) Field of Classification Search ................. 257/355, 257/E27.081, E27.016, 328, E29.328, E21.351, 257/E21.361
    See application file for complete search history.

(56) References Cited

U.S. PATENT DOCUMENTS

| | | | |
|---|---|---|---|
| 3,712,995 A * | 1/1973 | Steudel ...................... 361/110 |
| 5,012,313 A | 4/1991 | Fujihira |
| 5,079,608 A * | 1/1992 | Wodarczyk et al. ......... 257/355 |
| 5,726,472 A * | 3/1998 | Higashida .................... 257/341 |
| 5,973,359 A * | 10/1999 | Kobayashi et al. ........... 257/328 |
| 6,211,551 B1 * | 4/2001 | Suzumura et al. ........... 257/343 |
| 6,249,023 B1 | 6/2001 | Finney |
| 6,548,865 B2 | 4/2003 | Fujihira et al. |
| 6,563,169 B1 * | 5/2003 | Miyakoshi et al. .......... 257/339 |
| 6,750,507 B2 | 6/2004 | Williams et al. |
| 6,965,150 B2 | 11/2005 | Higashida et al. |
| 7,026,668 B2 * | 4/2006 | Hatakeyama et al. ....... 257/264 |
| 7,045,856 B2 * | 5/2006 | Hokomoto et al. .......... 257/328 |
| 7,417,295 B2 | 8/2008 | Kushiyama et al. |
| 7,651,917 B2 | 1/2010 | Kaneko |
| 2001/0009287 A1 | 7/2001 | Fujihira et al. |
| 2002/0050602 A1 | 5/2002 | Narazaki |

(Continued)

FOREIGN PATENT DOCUMENTS

CN    1794451    6/2006

(Continued)

OTHER PUBLICATIONS

Noguchi et al., U.S. Office Action mailed Mar. 6, 2009, directed to U.S. Appl. No. 11/860,206; 11 pages.

(Continued)

*Primary Examiner*—Leonardo Andújar
*Assistant Examiner*—Teresa M Arroyo
(74) *Attorney, Agent, or Firm*—Morrison & Foerster LLP

(57) ABSTRACT

Channel regions continuous with transistor cells are disposed also below a gate pad electrode. The channel region below the gate pad electrode is fixed to a source potential. Thus, a predetermined reverse breakdown voltage between a drain and a source is secured without forming a p+ type impurity region below the entire lower surface of the gate pad electrode. Furthermore, a protection diode is formed in polysilicon with a stripe shape below the gate pad electrode.

8 Claims, 12 Drawing Sheets

U.S. PATENT DOCUMENTS

| | | |
|---|---|---|
| 2002/0088991 A1 | 7/2002 | Hisamoto |
| 2002/0179945 A1* | 12/2002 | Sakamoto et al. ............ 257/288 |
| 2002/0190285 A1* | 12/2002 | Sakamoto et al. ............ 257/288 |
| 2003/0006415 A1* | 1/2003 | Yokogawa et al. ............. 257/77 |
| 2003/0057497 A1 | 3/2003 | Higashida et al. |
| 2004/0206989 A1* | 10/2004 | Aida et al. .................. 257/263 |
| 2005/0082611 A1* | 4/2005 | Peake et al. ................. 257/341 |
| 2006/0071257 A1* | 4/2006 | Kang ......................... 257/295 |
| 2006/0131645 A1 | 6/2006 | Kaneko |
| 2006/0255407 A1* | 11/2006 | Ishida ........................ 257/347 |
| 2007/0034943 A1* | 2/2007 | Kushiyama et al. .......... 257/330 |
| 2007/0262390 A1* | 11/2007 | Ishida et al. ................ 257/368 |
| 2008/0061326 A1 | 3/2008 | Yoshida et al. |
| 2008/0079078 A1* | 4/2008 | Noguchi et al. ............. 257/355 |
| 2008/0079079 A1* | 4/2008 | Noguchi et al. ............. 257/355 |
| 2008/0142799 A1 | 6/2008 | Kaneko |
| 2009/0057757 A1 | 3/2009 | Hokomoto et al. |
| 2009/0078992 A1 | 3/2009 | Kaneko |
| 2009/0261418 A1 | 10/2009 | Yajima |
| 2010/0044749 A1 | 2/2010 | Kitamura et al. |

FOREIGN PATENT DOCUMENTS

| | | |
|---|---|---|
| JP | 1-280359 | 11/1989 |
| JP | 03071673 A * | 3/1991 |
| JP | 2002-43574 | 2/2002 |
| JP | 2002-368218 | 12/2002 |
| JP | 2002368218 A * | 12/2002 |

OTHER PUBLICATIONS

Noguchi et al., U.S. Office Action mailed Sep. 10, 2009, directed to U.S. Appl. No. 11/860,206; 16 pages.

Noguchi et al., U.S. Office Action mailed Mar. 19, 2010, directed to U.S. Appl. No. 11/860,206; 15 pages.

* cited by examiner

Prior Art

Prior Art

Prior Art

INSULATED-GATE SEMICONDUCTOR DEVICE

This invention claims priority from Japanese Patent Application Number JP 2006-265386 filed on Sep. 28, 2006, the content of which is incorporated herein by reference in its entirety.

BACKGROUND OF THE INVENTION

1. Field of the Invention

The present invention relates to an insulated-gate semiconductor device, and particularly to an insulated-gate semiconductor device in which an operation region is sufficiently secured, and in which a high reverse breakdown voltage is maintained.

2. Description of the Related Art

In a conventional insulated-gate semiconductor device, a transistor cell is not disposed below a gate pad electrode. This technology is described, for instance, in Japanese Patent Application Publication No. 2002-368218 (FIG. 6 to FIG. 8).

Meanwhile, a protection diode is disposed below the gate pad electrode in some cases, and a number of pn junctions are connected to each other in series in the protection diode, for example. Moreover, a diffusion region of high-concentration impurities is sometimes formed in a substrate below the gate pad electrode in order to secure a reverse breakdown voltage between a drain and a source.

FIGS. 11A and 11B show one example of an n channel MOSFET as the conventional insulated-gate semiconductor device, in which a p+ type impurity region is formed below the gate pad electrode.

FIG. 11A is a plan view of the MOSFET. Note that, interlayer insulating films on the surface of the substrate are omitted in FIG. 11A. Metal electrode layers (a source electrode 47, a gate pad electrode 48 and a gate wiring 48a) are indicated by the dashed lines.

Gate electrodes 43 are formed into a stripe shape on the surface of a semiconductor substrate 31 with gate oxide films 41 interposed therebetween. The gate electrodes 43 are formed by patterning polysilicon which has been deposited and then doped with impurities to reduce the resistance. Source regions 45 are formed in the surface of the substrate 31 along the gate electrodes 43. The source regions 45 are formed along the gate electrodes 43, and have a stripe shape.

The source electrode 47 is formed on an operation region 51 where transistor cells are disposed. The gate pad electrode 48 is disposed on one edge of a chip. The gate wiring 48a, which is connected to the gate pad electrode 48, is formed around the chip.

FIG. 11B is a cross-sectional view taken along the line f-f in FIG. 11A.

The semiconductor substrate 31 is provided with a drain region by stacking an n+ type silicon semiconductor substrate 31a with an n− type epitaxial layer 31b or the like. Multiple p type channel regions 34 are formed into a stripe shape in the surface of the semiconductor substrate 31. The multiple gate electrodes 43 are disposed in the stripe shape on the surface of the semiconductor substrate 31 on sides of the channel regions 34 while the gate insulating films 41 are interposed between the gate electrodes 43 and the semiconductor substrate 31. The n+ type source regions 45 are formed in the surface of the channel region 34 which is adjacent to the gate electrodes 43. The top of the gate electrode 43 is covered with the interlayer insulating film 46, and the source electrode 47 is formed thereon. The source electrode 47 is in contact with the source regions 45. The region surrounded by the gate electrodes 43 serves as the single transistor cell. A large number of these cells are disposed to form the operation region 51.

The gate pad electrode 48 is formed above the n− type semiconductor layer 31b outside the operation region 51. The gate pad electrode 48 is connected to the gate electrodes 43 in the operation region 51 through a gate leading electrode 43a. Moreover, a protection diode 43d formed by doping impurities in polysilicon is disposed below the gate pad electrode 48. The p+ type impurity region 49 is formed in the same pattern as that of the protection diode 43d.

When the reverse voltage is applied between the source and the drain, depletion layers are spread from in pn junctions between the channel regions 34 and the n− type semiconductor layers 31b over the operation region 51, thereby securing the reverse breakdown voltage between the source and the drain. Meanwhile, the protection diode 43d is formed on the one edge of the chip, and transistor cells (channel regions 34) are not disposed in the substrate surface below the protection diode 43d. For this reason, the p+ type impurity region 49 is formed in the substrate surface below the protection diode 43d. For example, if the pn junction is ended at the end portion of the operation region 51, the curvature of the depletion layer spreading at this region is increased, resulting in a problem that the reverse breakdown voltage between the source and the drain is deteriorated due to the electric field concentration. However, by forming the p+ type impurity region 49, the spreading of the depletion layer at the end portion of the operation region 51 can be moderately extended to the one edge of the chip. In other words, the curvature at the end of the operation region 51 is decreased, allowing the electric field concentration to be mitigated. Thus, it is possible to secure a predetermined reverse breakdown voltage between the source and the drain.

The protection diode 43d is made into a rectangular shape by patterning the polysilicon as shown in FIGS. 11A and B, for example. In the protection diode 43d, a number of pn junctions are formed in concentric circles as shown by the chain lines. Specifically, in the conventional art, the protection diode 43d having a large area is patterned below the entire lower surface of the gate pad electrode 48 so as to overlap the gate pad electrode 48. Accordingly, the p+ type impurity region 49 having the large area needs to be disposed from the outside of the operation region 51 where the transistor cells are not disposed to the one edge of the chip.

FIG. 12A and FIG. 12B are diagrams for describing the p+ type impurity region 49. FIG. 12A shows a perspective view of the p+ type impurity region 49 at the circle portion in FIG. 11A as viewed from the operation region 51 where the transistor cells (MOSFET) are disposed. FIG. 12B shows a plan view of another pattern of the p+ type impurity region 49, while omitting the interlayer insulating films on the surface, and indicating the metal electrode layers with the dashed lines.

The p+ type impurity region 49 is a diffusion region, and has the curvature of a spherical shape (FIG. 12A) at the end portion (the junction surface with the n− type epitaxial layer 31b) indicated by the circle in FIG. 11A. Here, suppose a case where a higher (for example, several hundreds V) reverse breakdown voltage is needed between the drain and the source in the pattern shown in FIG. 11. In this case, even if the p+ type impurity region 49 is disposed, high electric field is concentrated at the end portion (indicated by the arrows in FIG. 12A) having the curvature of the spherical shape. Accordingly, it is impossible to obtain a desired reverse breakdown voltage between the drain and the source.

Moreover, in order to reduce the on-resistance of the device, the specific resistance in the n− type epitaxial layer 31b needs to be reduced, for example. In such a case, the pattern of the p+ type impurity region 49 shown in FIG. 11 leads to decrease in the reverse breakdown voltage between the source and the drain.

In other words, when the property required for the operation region 51 is changed, the pattern of the p+ type impurity region 49 needs to be modified, besides the operation region 51, in order to obtain a predetermined reverse breakdown voltage between the source and the drain.

Specifically, by decreasing the curvature of the spherical shape, it is possible to secure a sufficient reverse breakdown voltage between the drain and the source. More specifically, as shown in FIG. 12B, by decreasing the curvature at corners of the p+ type impurity region 49 in the plane pattern, it is possible to decrease the curvature of the spherical shape shown in FIG. 12A, and accordingly to secure a predetermined reverse breakdown voltage.

Nevertheless, when the protection diode 43d is patterned below the gate pad electrode 48 so as to be substantially overlapped with the gate pad electrode 48, the p+ type impurity region 49 needs to be formed so as to cover the substrate surface below the protection diode 43d. Specifically, in a case where a sufficient reverse breakdown voltage between the drain and the source must be secured, the forming the p+ type impurity region 49 in the same pattern as that of the protection diode 43d inevitably causes the curvature at the corners of the p+ type impurity region 49 to be small. Accordingly, in the pattern shown in FIG. 12, some of the transistor cells adjacent to the gate pad electrode 48 cannot be disposed. This produces a problem of making it inevitable not only to regulate (or modify the design of) the p+ type impurity region 49, but also to reduce the operation region (area for disposing the transistor cells).

SUMMARY OF THE INVENTION

The invention provides an insulated-gate semiconductor device that includes a semiconductor substrate of a first general conductivity type, a plurality of gate electrodes formed on or in a surface portion of the semiconductor substrate in a form of stripes running in a first direction, a plurality of channel regions of a second general conductivity type formed in the surface portion in a form of stripes running in the first direction, a first insulating film formed between each of the gate electrodes and a corresponding channel region, a plurality of source regions of the first general conductivity type formed in the channel regions in a form of stripes running in the first direction, a gate pad electrode formed on the surface portion so that portions of the channel regions are disposed under the gate pad electrode, a plurality of pn junction diodes formed on or in the surface portion so as to be under the gate pad electrode and extend in the first direction; and a second insulating film formed on each of the gate electrodes, on the pn junction diodes and on the portions of the channel regions.

DETAILED DESCRIPTION OF THE PREFERRED EMBODIMENTS

Description will be given specifically of embodiments according to the present invention by exemplifying an n channel MOSFET as an insulated-gate semiconductor device with reference to FIG. 1 to FIG. 10.

FIG. 1 to FIG. 7 show the first embodiment of the present invention.

Figure 1A:
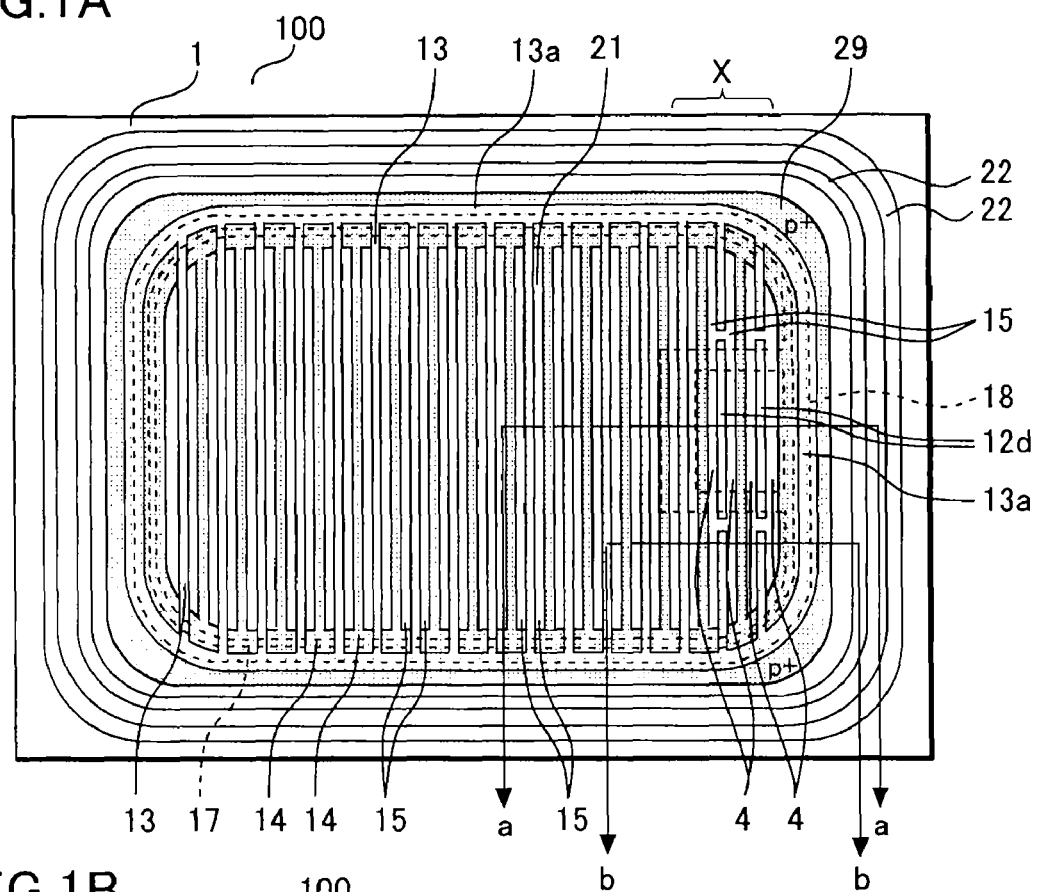
FIG. 1A and FIG. 1B are plan views of a semiconductor device according to a first embodiment of the present invention.
Figure 1B:
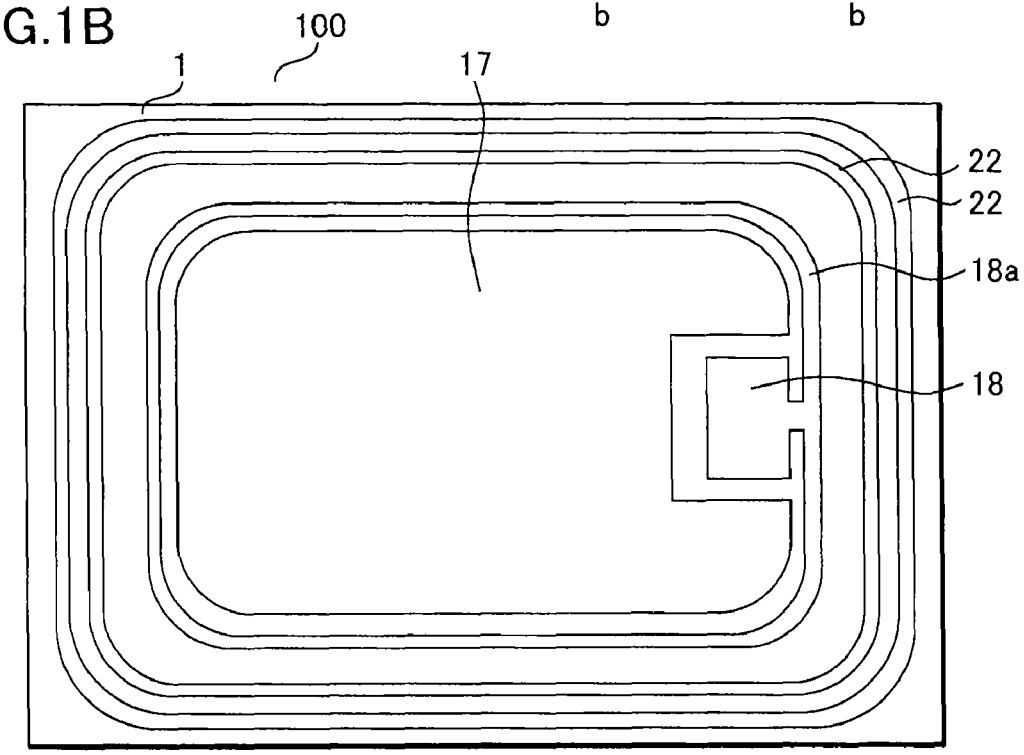

FIG. 1A and FIG. 1B are plan views showing a chip on the MOSFET according to the first embodiment of the present invention. FIG. 1A is the plan view showing metal electrode layers (a source electrode, a gate pad electrode and a gate wiring) by the dashed lines, omitting interlayer insulating films. FIG. 1B is the plan view showing a pattern of the source electrode, the gate pad electrode and the gate wiring.

MOSFETs 100 according to the present invention mainly include an n type semiconductor substrate 1, channel regions 4, first insulating films 11, gate electrodes 13, source regions 15, body regions 14, second insulating films 16, a gate pad electrode 18, a source electrode 17, and a protection diode 12d.

As shown in FIG. 1A, the gate electrodes 13 are formed in a stripe shape on the surface of the n type semiconductor substrate 1 with gate oxide films which is the first insulating films (unillustrated here) interposed therebetween. The gate electrodes 13 are formed by patterning polysilicon which has been deposited and then doped with impurities to reduce the resistance.

The channel regions 4 are p type impurity regions formed in the surface of the n type semiconductor substrate 1 into a stripe shape along the gate electrodes 13.

The source regions 15 are n+ impurity regions formed in the surface of the channel regions 4 along the gate electrodes 13. Each of the body regions 14 is a p+ type impurity region formed along the gate electrodes 13, and between the adjacent source regions 15 in the surface of the channel region 4, so as to stabilize the electric potential of the substrate.

It is noted that conductivity types such as p+, p and p− belong in one general conductivity type and conductivity types such as n+, n and n− belong in another general conductivity type.

The source regions 15 and the channel region 4 (body region 14), which are surrounded by the gate electrodes 13, form a transistor cell of the MOSFET with a stripe shape. A large number of the transistor cells are disposed to form an operation region 21 of the MOSFETs 100. The transistor cells are disposed up to one edge of the chip. All the gate electrodes 13 are connected to a gate leading electrode 13a which surrounds the outer periphery of the operation region 21, and which is disposed on the surface of the n type semiconductor substrate 1 with the gate oxide film interposed therebetween. The gate leading electrode 13a is also polysilicon doped with impurities to reduce the resistance as in the case of the gate electrode 13.

The gate pad electrode 18 is disposed along one side of the chip. Note that, although FIG. 1 shows an example of the gate pad electrode 18 disposed near the center of the one side of the chip, the gate pad electrode 18 may be disposed at a corner of the chip. The gate pad electrode 18 is a metal electrode layer formed above the n+ type semiconductor substrate 1 with the interlayer insulating films which is the second insulating films (unillustrated here) interposed therebetween. Moreover, a gate wiring 18a is formed on the n type semiconductor substrate surrounding the outer periphery of the operation region 21 via the interlayer insulating films, and connected to the gate pad electrode 18. The gate wiring 18a and the gate pad electrode 18 are made of the same metal electrode layer. The gate wiring 18a is in contact with the gate leading electrode 13a, and thereby the gate voltage is applied to the gate electrode 13 of each transistor cell.

The gate leading electrode 13a is formed in the same ring shaped pattern as that of the gate wiring 18a, and thus these shapes substantially superpose with each other. A p+ type impurity region 29 is formed in the surface of the n type semiconductor substrate 1 below the gate leading electrode 13a in a ring shaped pattern as being substantially superposed with the gate leading electrode 13a. The p+ type impurity region 29 surrounding the outer periphery of the chip is connected to the channel regions 4 with the stripe shape, and applied with the same source potential as the channel regions 4 are. As a result, the curvature of a depletion layer at the outer periphery of the chip is decreased.

The gate pad electrode 18 is not in contact with the channel regions 4 and the body regions 14 therebelow. Additionally, no source region 15 is disposed in the channel regions 4 below the gate pad electrode 18.

Guard rings 22 which are diffusion region are disposed in the surface of the n type semiconductor substrate 1 around the gate leading electrode 13a as necessary. The guard rings 22 are, for example, p type impurity regions to which any electric potential is applied.

The source electrode 17 is formed adjacent to and surrounds the gate pad electrode 18 as shown in FIG. 1B. The source electrode 17 is made of the same metal electrode layer as that of the gate pad electrode 18, covers a large area of the operation region 21, and thereby electrically connects to each transistor cell.

The transistor cells according to this embodiment are stripe-shaped. Accordingly, the transistor cells in an X area shown in FIG. 1A are also applied with a predetermined electric potential by the source electrode 17 (see FIG. 1B), and performs the transistor operation while the potential is fixed.

It should be noted, however, that each of the source regions 15 and the gate electrodes 13 in the transistor cells in the X region is divided on both side of the gate pad electrode 18. In other words, the source regions 15 and the gate electrodes 13 are not disposed below the gate pad electrode 18. Specifically, the body regions 14 and the source regions 15 are disposed in the surfaces of the channel regions 4 at the operation region 21 below the source electrode 17, and thus the channel regions 4 are not exposed in the plan view of FIG. 1A. On the other hand, below the gate pad electrode 18, the channels 4 (and the body regions 14) are exposed.

Accordingly, when predetermined electric potentials (a gate potential and a source potential) are applied to the gate electrodes 13 and the channel regions 4 with the stripe shapes, only the transistor cells below the source electrode 17 perform the transistor operation. Meanwhile, since some of the channel regions 4 are extended below the gate pad electrode 18 also, the source potential is applied thereto.

The protection diode 12d with a stripe shape is formed below the gate pad electrode 18. Detailed description of the protection diode 12d will be given later.

The protection diode 12d is formed in the same pattern as that of the gate electrode 13. However, the protection diode 12d is set apart from the gate electrodes 13 disposed in the extending direction of the protection diode 12d in predetermined distances.

Figure 2:
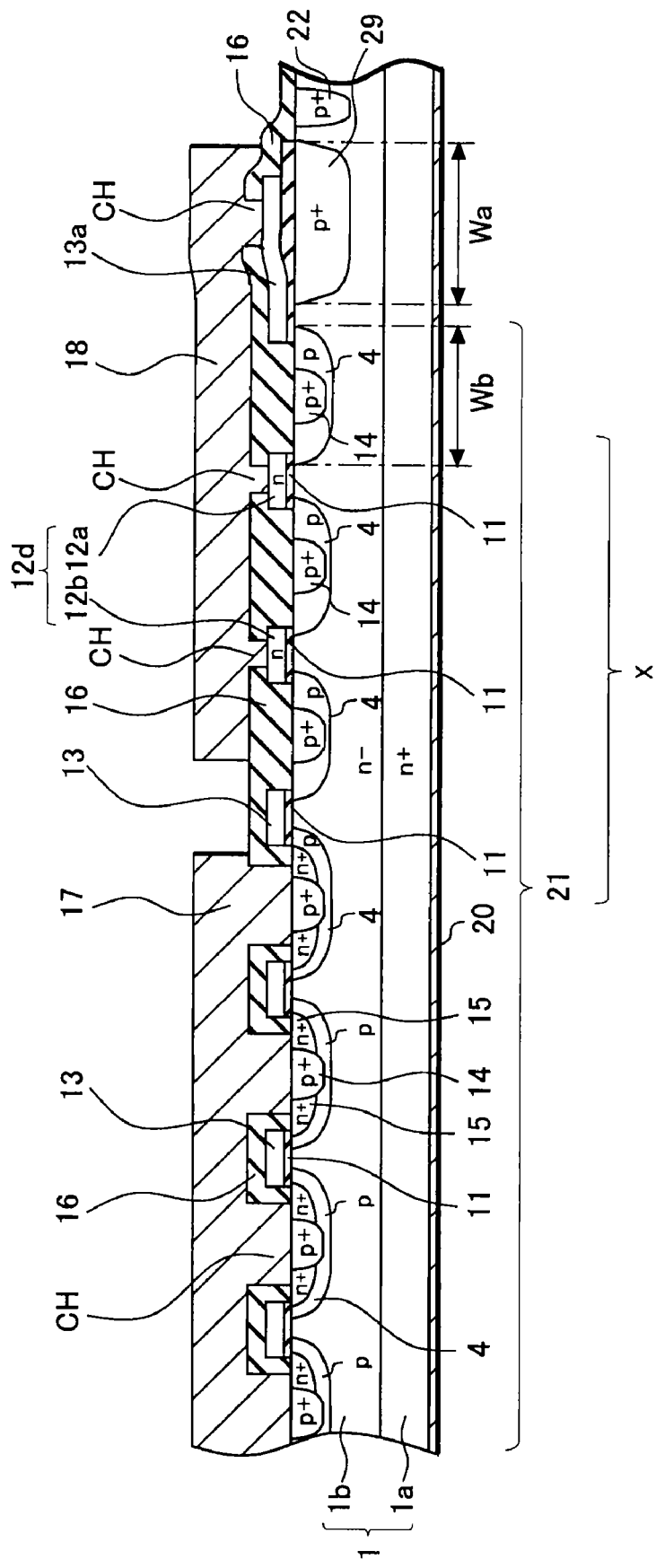
FIG. 2 is a cross-sectional view of the semiconductor device according to the first embodiment of the present invention.
Figure 3:
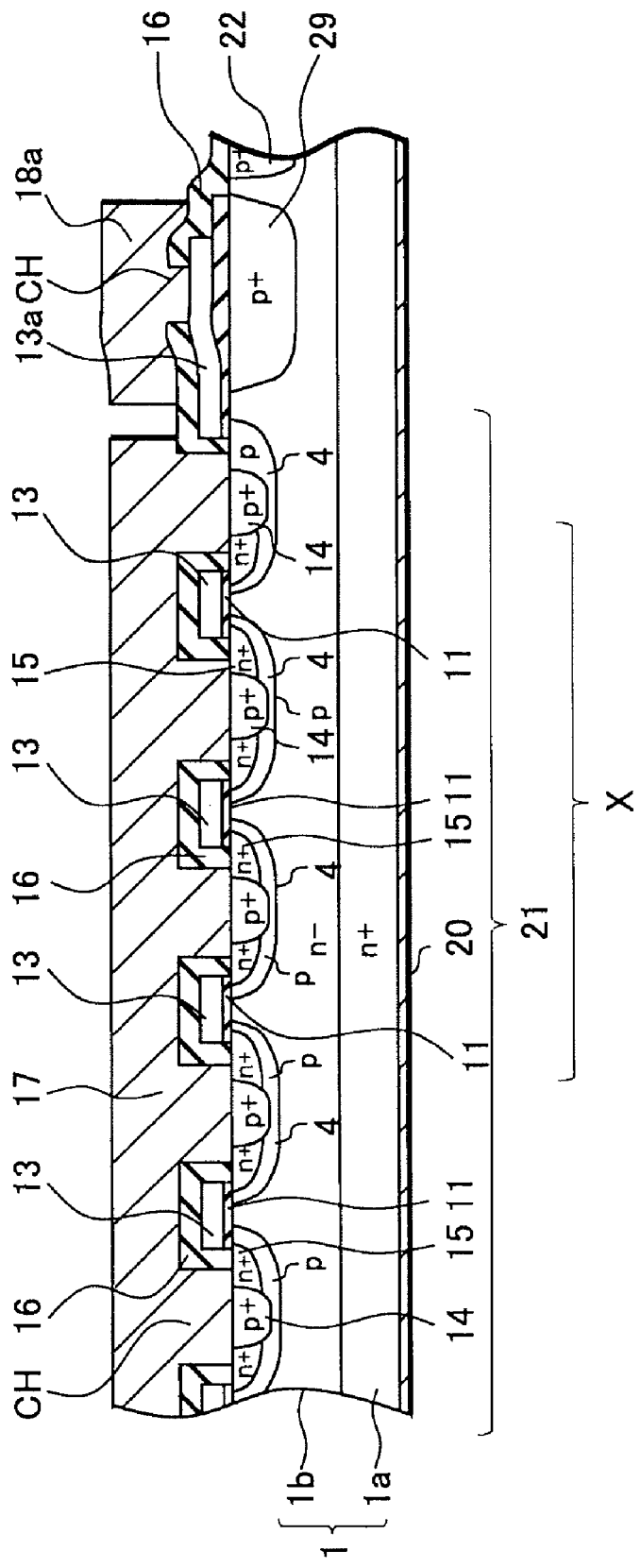
FIG. 3 is a cross-sectional view of the semiconductor device according to the first embodiment of the present invention.

FIG. 2 and FIG. 3 show cross-sectional views of the MOSFET according to this embodiment. FIG. 2 is the cross-sectional view taken along the line a-a in FIG. 1A. FIG. 3 is the cross-sectional view taken along the line b-b in FIG. 1A.

In the n type semiconductor substrate 1, a drain region is formed by stacking an n+ type silicon semiconductor substrate 1a with an n− type semiconductor layer 1b, for example. The n-type semiconductor layer 1b is, for example, an epitaxial layer. The multiple channel regions 4 are formed in the surface of the n− type semiconductor layer 1b into the stripe shape.

The source regions 15, which are n+ type impurity regions, as well as the body region 14, which is a p+ type impurity region, are formed in the surface of the channel region 4 below the source electrode 17. The gate electrode 13 made of the polysilicon is disposed in the stripe shape on the substrate surface between the adjacent channel regions 4 with the gate oxide films between the substrate and the gate electrode 13. The source regions 15 are formed on both sides of the gate electrodes 13 so as to be partially superposed with the corresponding gate electrodes 13. The body region 14 is disposed in the surface of the channel region 4 between the adjacent source regions 15.

Specifically, the channel region 4, the source regions 15 and the body region 14 are disposed in the stripe shapes on both sides of and along the gate electrodes 13 with the stripe shape.

The interlayer insulating film 16 made of a BPSG (Boron Phosphorus Silicate Glass) film or the like is formed on the top surface and side surfaces of the gate electrode 13. Thus, the periphery of the gate electrode 13 is covered with the gate insulating film 11 and the interlayer insulating film 16.

The source electrode 17 is formed by patterning the metal electrode layer into a predetermined shape on the interlayer insulating films 16 (see FIG. 1B).

As shown in FIG. 2, contact holes CH are formed in the interlayer insulating films 16 below the source electrode 17. The source electrode 17 is in contact with the source regions 15 and the body regions 14 (channel regions 4) via the contact holes CH.

The protection diode 12d, the body regions 14, the channel regions 4, gate oxide films 11, the interlayer insulating films 16 and the gate leading electrode 13a are disposed below the gate pad electrode 18. Herein, the protection diode 12d includes the two pn junction diodes 12a and 12b with stripe shape. The gate pad electrode 18 is in contact with the gate leading electrode 13a via the contact holes CH formed in the interlayer insulating film 16. Moreover, the gate pad electrode 18 applies the gate potential to one end of each protection diode 12d via the contact hole CH formed in the interlayer insulating film 16 therebelow.

As described above, no source region 15 is disposed in the channel regions 4 below the gate pad electrode 18, and then no transistor cell is formed below the gate pad electrode 18. Meanwhile, the body regions 14 and the channel regions 4 below the gate pad electrode 18 are connected to the source electrode 17 (FIG. 1A), and then the source potential is applied thereto.

As shown in FIG. 3, the gate electrode 13, the channel region 4 and the source region 15 with the stripe shapes are formed below the source electrode 17 surrounding the gate pad electrode 18 in the X region, and thereby a transistor cell is formed.

The channel regions 4 and the body regions 14 in the X region are up to below the gate pad electrode 18. In this embodiment, the region where the channel regions 4 are disposed in FIG. 2 and FIG. 3 is the operation region 21.

As shown in FIG. 2 and FIG. 3, the source potential is applied to the channel regions 4 below the gate pad electrode 18 as in the case of the channel regions 4 of the transistor cell. Moreover, the channel regions 4 (and also the body regions 14) below the gate pad electrode 18 are formed in the same pattern as that of the operation region 21. The channel regions 4 (and also the body regions 14) in the operation region 21 are formed in a condition where the breakdown voltage required for the MOSFET is secured. Thus, the reverse breakdown voltage between the drain and the source equal to that of the operation region 21 is secured even in the channel regions 4 below the gate pad electrode 18.

For this reason, the channel region 4 with the stripe shape makes it possible to secure the reverse breakdown voltage between the drain and the source below the gate pad electrode 18. Thus, the conventional p+ type impurity region with a large area is no longer necessary.

In other words, it suffices to form the p+ type impurity region 29 according to this embodiment only at the outer periphery of the chip where no channel region 4 is disposed. It is only necessary that the p+ type impurity region 29 be formed in the pattern of being substantially superposed with the gate leading electrode 13a with the ring shape, and thereby a width Wa of the p+ type impurity region 29 is greatly reduced as compared to that of the conventional impurity region.

Specifically, the width Wa of the p+ type impurity region 29 is larger than a width Wb of the channel region 4, and for example 50 μm in a case where the breakdown voltage is approximately 600V. In the conventional art (FIG. 11) where the impurity region is formed in the entire surface below the protection diode 43d, a width Wc of the p+ type impurity region 49 is, for example, 400 μm. Thus, the width Wa is reduced to approximately ⅛ of that of the conventional impurity region.

Conventionally, the protection diode 43d with the concentric-circular shape and the p+ type impurity region 49 having a large area superposed therewith are disposed below the gate pad electrode 48. When the breakdown voltage required for the operation region 51 is changed, the pattern of the p+ type impurity region 49 (curvature at the corners) also needed to be modified appropriately.

In the meanwhile, according to this embodiment, by forming the channel regions 4 (body regions 14) with the same design rule (size and impurity concentration) as that of the operation region 21 below the gate pad electrode 18, the reverse breakdown voltage between the drain and the source equal to the breakdown voltage required for the operation region 21 is secured below the gate pad electrode 18.

Moreover, when the breakdown voltage in the operation region 21 is modified, a predetermined breakdown voltage is secured below the gate pad electrode 18 also by modifying the setting value of the channel regions 4 in the operation region 21. In other words, as the setting value in the operation region 21 is modified, a predetermined reverse breakdown voltage between the drain and the source is secured below the gate pad electrode 18.

The p+ type impurity region 29 surrounds the outer periphery of the chip where no channel region 4 is disposed, and connected to the channel regions 4 with the stripe shape (FIG. 1A). Accordingly, the p+ type impurity region 29 and the channel regions 4 have the same electric potential (the source potential). Thus, when the reverse voltage is applied between the source and the drain, the curvature of the depletion layer is decreased at the outer periphery of the chip where no channel region 4 is disposed, and thereby the electric field concentration is suppressed.

The guard rings 22, which are the diffusion regions of the p+ type impurities, are disposed at the outer periphery of the p+ type impurity region 29 as necessary. No electric potential is applied to the guard rings 22, and thereby the electric field concentration which occurs between the source and the drain around the p+ type impurity region 29 is mitigated.

Furthermore, a drain electrode 20 is formed on the back surface of the n type semiconductor layer 1 where the drain electrode 20 comes into contact with the n+ type semiconductor substrate 1a.

Incidentally, the channel regions 4 with the stripe shape below the gate pad electrode 18 are formed by self-alignment using the polysilicon with the stripe shape as a mask. That is, in this embodiment, the polysilicon which serves as the mask below the gate pad electrode 18 remains. And unlike that of the operation region 21, the polysilicon does not function as the gate electrode 13.

For this reason, p type semiconductor regions 12p and n type semiconductor regions 12n are formed in the polysilicon serving as the mask for forming the channel regions 4. One end of the polysilicon is connected to the gate pad electrode 18, and the other end is connected to the source electrode 17, and thereby the protection diode 12d is formed.

Hereinafter, description will be given of the protection diode 12d with reference to FIG. 4 to FIG. 7.

Figure 4:
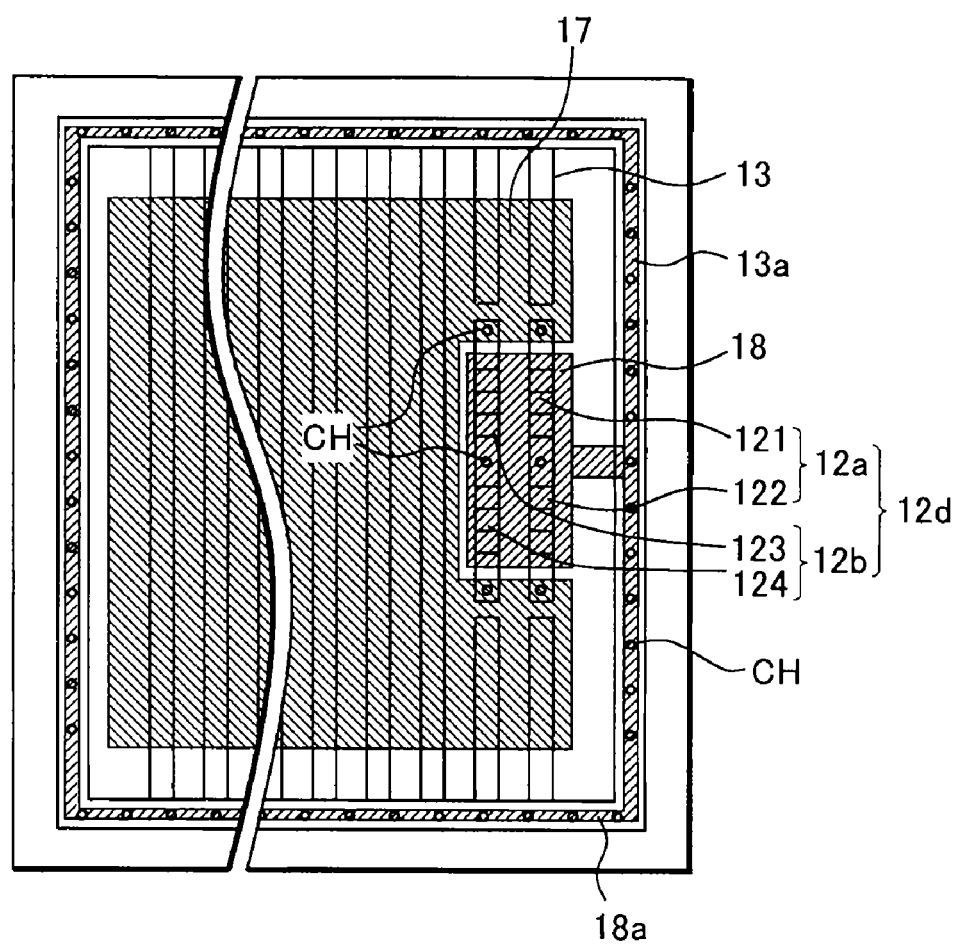
FIG. 4 is a schematic plan view of the semiconductor device according to the first embodiment of the present invention.
Figure 5:
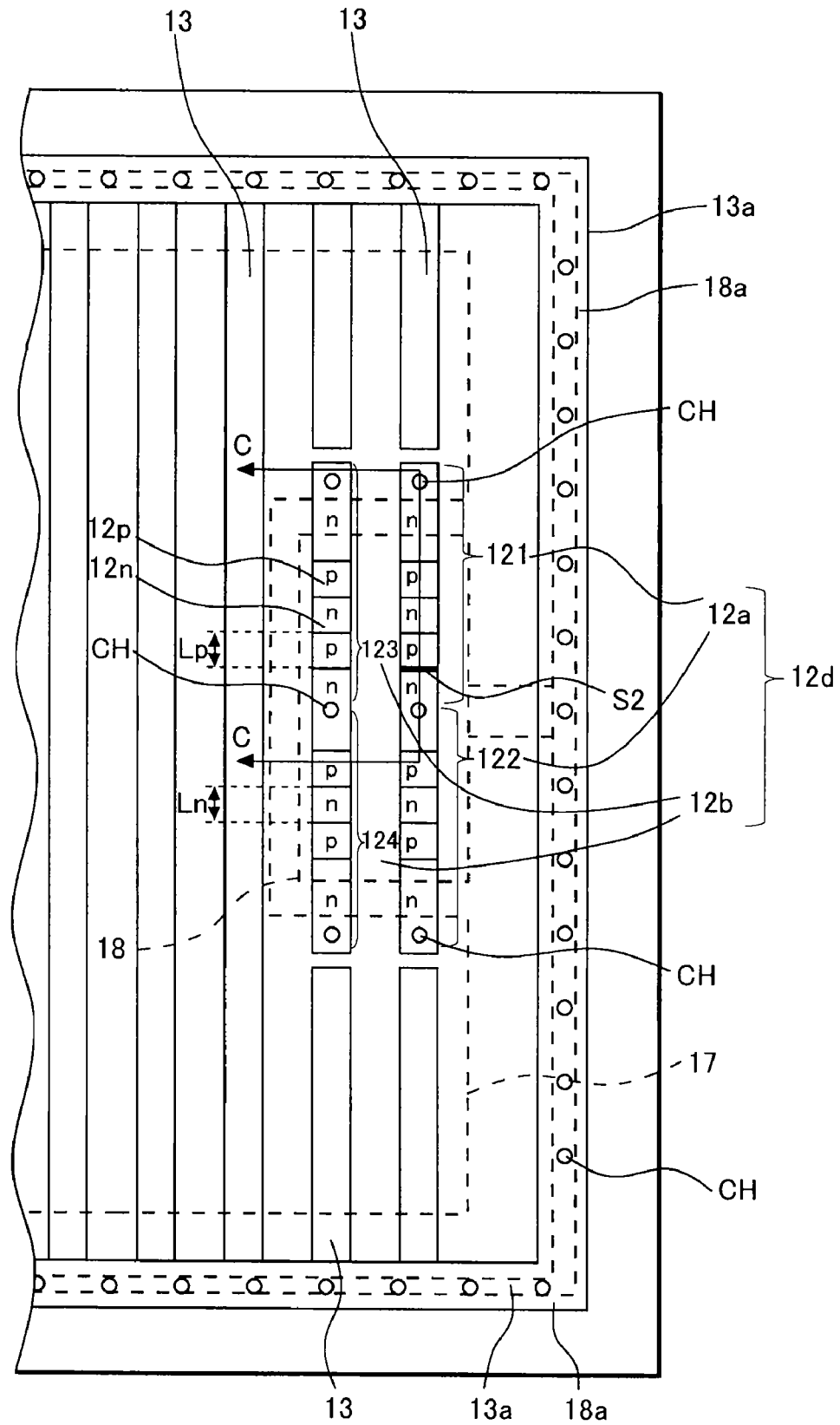
FIG. 5 is an enlarged plan view of the semiconductor device according to the first embodiment of the present invention.
Figure 6A:
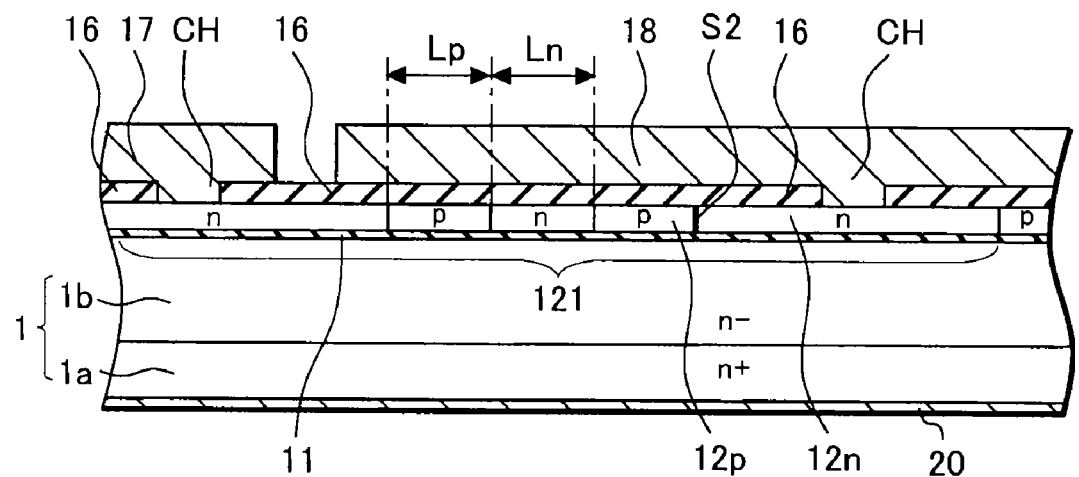
FIG. 6A is a cross-sectional view.
Figure 6B:
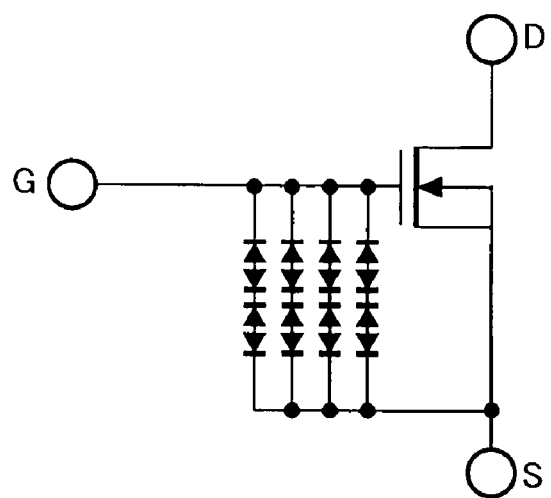
FIG. 6B is a circuit diagram, of the semiconductor device according to the first embodiment of the present invention.

FIG. 4 to FIG. 6 are diagrams for describing the protection diode 12d according to this embodiment. FIG. 4 is the schematic plan view for describing the protection diode 12d. FIG. 5 is the enlarged plan view of FIG. 4. FIG. 6A is the cross-sectional view taken along the line c-c in FIG. 5. FIG. 6B is the equivalent circuit diagram of the protection diode 12d.

Note that, in FIG. 4 and FIG. 5, configurations other than that of the protection diode 12d are schematically shown. In FIG. 5, the interlayer insulating films are omitted, and the source electrode 17 and the gate pad electrode 18 are indicated by the dashed lines.

As shown in FIG. 4 and FIG. 5, for example, four pn junction diodes 121 to 124 are disposed below the gate pad electrode 18.

Hereinafter, description will be given of the pn junction diode 121. The configurations of the other pn junction diodes 122 to 124 are the same as that of the pn junction diode 121.

The pn junction diode 121 is formed as follows. Firstly, the p type semiconductor regions 12p and the n type semiconductor regions 12n are alternately disposed adjacent to one another by implanting ions of p type and n type impurities, or by the deposition (PBF (Poly Boron Film) and $POCl_3$), into the polysilicon serving as the mask for forming the channel regions 4. Accordingly, pn junctions are formed. Then, on one end (for example, the n type impurity region 12n) is connected to the gate pad electrode 18, and the other end (for example, another n type impurity region 12n) is connected to the source electrode 17.

The pn junction diodes 121 and 122 are connected to each other in parallel while sharing the gate pad electrode 18. Each one end of the pn junction diodes 121 and 122, which is an end opposite to the connection portion interposed therebetween, is connected to the source electrode 17. Thus, the pn junction 12a with a stripe shape is formed. Specifically, the pn junction diode 12a is formed as follows. Firstly, the polysilicon is patterned at the same time as the gate electrode 13 is patterned which is disposed in the extending direction of the pn junction diode 12a. Then, the pn junction diode 12a is formed by being divided from the gate electrode 13 in a predetermined separation distance. As a result, the pn junction diode 12a has the same width as that of the gate electrode 13.

Similarly, the pn junction diode 12b is formed in a stripe shape by connecting the pn junction diodes 123 and 124 to each other in parallel.

Moreover, each of the pn junction diodes 12a and 12b with the stripe shapes is connected to each other in parallel by being connected both ends to the gate pad electrode 18 and the source electrode 17, respectively. In other words, according to this embodiment, the four pn junction diodes 121 to 124 are connected in parallel, and thereby the protection diode 12d between the gate and the source of the MOSFET is formed. Note that the gate oxide films 11 and the n– type semiconductor layer 1b are disposed immediately below the protection diode 12d as shown in FIG. 2.

Further description will be given with reference to FIG. 6.

As shown in FIG. 6A and FIG. 2, the periphery of the pn junction diode 121 is covered with the interlayer insulating film 16, and then the one end thereof (the p type semiconductor region 12p or the n type semiconductor region 12n) is connected to the gate pad electrode 18 via the contact holes CH formed in the interlayer insulating film 16. The other end (another p type semiconductor region 12p or another n type semiconductor region 12n) is connected to the source electrode 17.

Accordingly, as shown in FIG. 6B, the pn junction diodes 121 to 124 are connected in parallel, and thereby the single protection diode 12d is formed. The protection diode 12d is connected between a source terminal S and a gate terminal G of the MOSFET having the source terminal S, the gate terminal G and a drain terminal D.

Note that the number of series connections of the pn junctions in the pn junction diodes 121 to 124, the number of the pn junction diodes 12a and 12b with the stripe shapes, as well as the contact positions with the gate pad electrode 18 and the source electrode 17 have been exemplified, and these settings are appropriately selected in accordance with the breakdown voltage.

For example, by shifting the positions of the contact holes CH for the gate pad electrode 18 in the protection diode 12d shown in FIG. 5, the breakdown voltage is easily modified. In such a case, the pn junction diodes 121 to 124 need to have the same configurations (the same number of pn junctions). Thus, for one line of the stripe-shaped pn junction diode 12a, the two contact holes CH are formed below the gate pad electrode 18.

Figure 7:
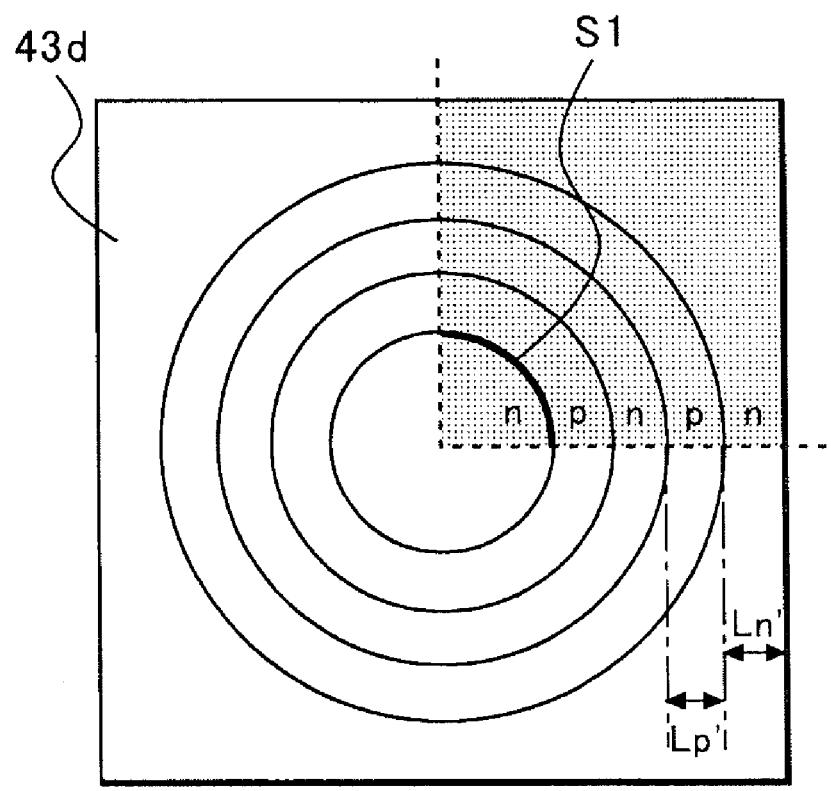
FIG. 7 is a plan view for describing a conventional protection diode and a protection diode according to the first embodiment of the present invention.
Figure 11A:
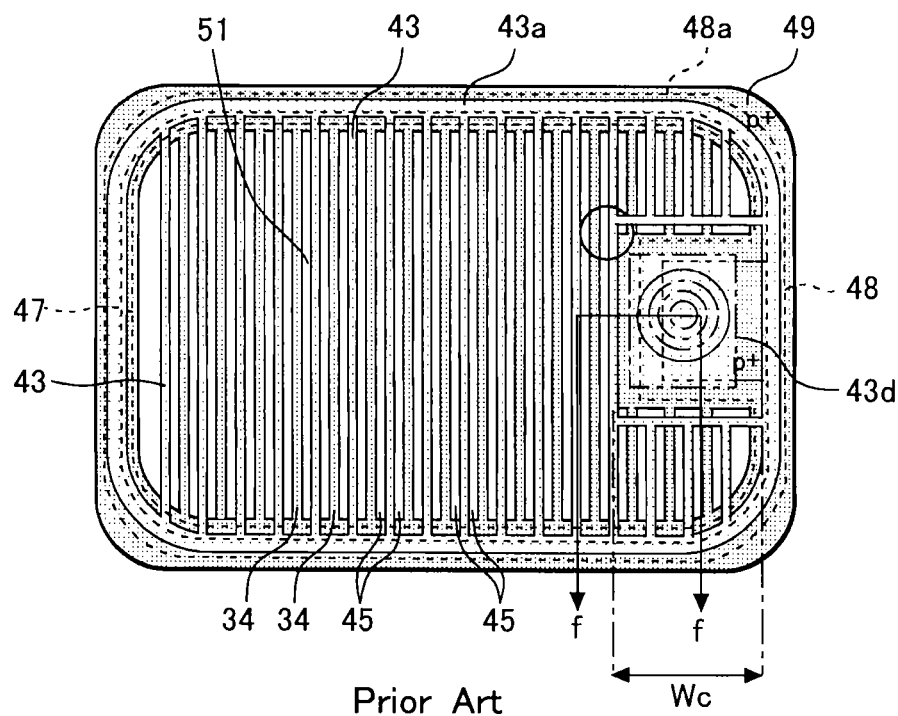
FIG. 11A is a plan view.
Figure 11B:
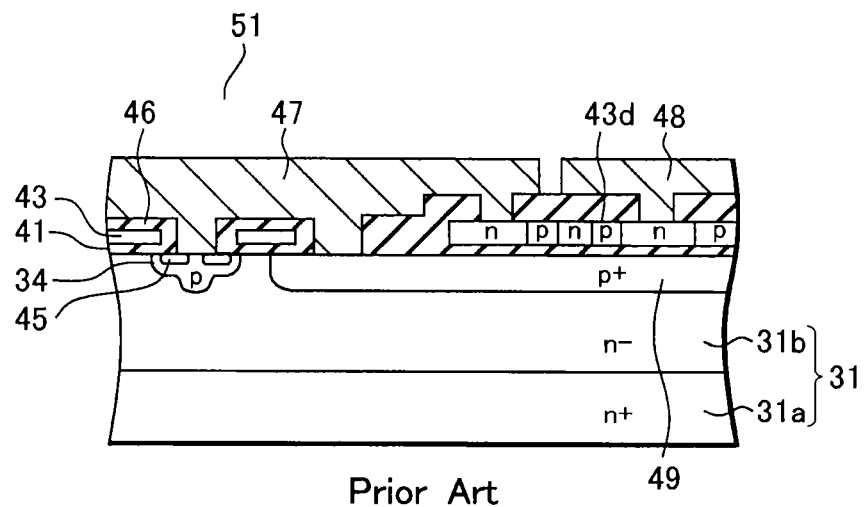
FIG. 11B is a cross-sectional view, for describing a conventional semiconductor device.
Figure 12A:
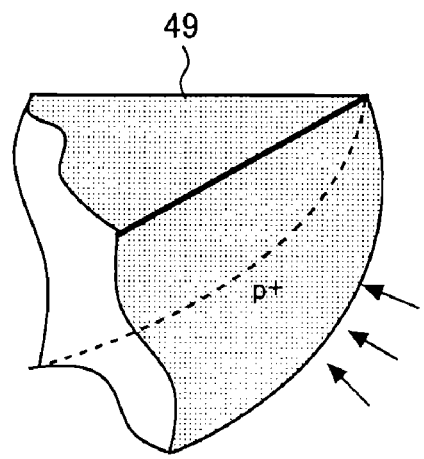
FIG. 12A is a perspective view.
Figure 12B:
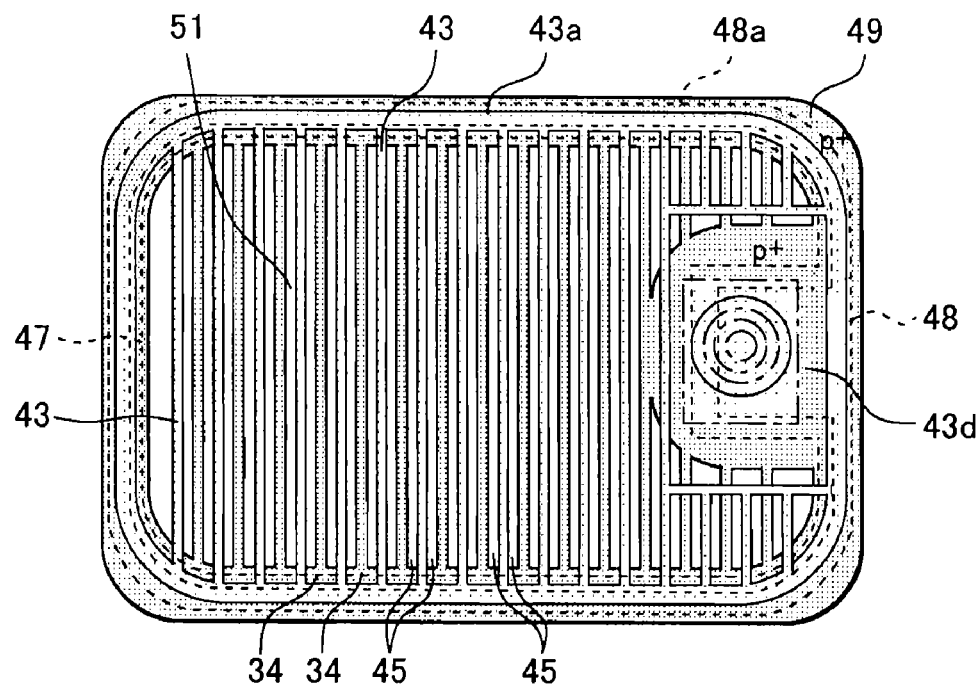
FIG. 12B is a cross-sectional view, for describing the conventional semiconductor device.

FIG. 7 shows the conventional protection diode 43d shown in FIG. 11. Generally, in the protection diode 43d, the pn junctions are connected in series in the concentric circles.

The pn junction diode 121 according to this embodiment corresponds to the portion indicated by the dashed line and the hatching in FIG. 7. In the protection diode 43d forming the pn junctions in the concentric circles, the area within the innermost periphery of the pn junction is the smallest. By this area, the current capacity of the reverse current is determined, that is, the breakdown voltage of the protection diode 43d is determined. Additionally, by series-connecting the multiple pn junctions having a predetermined breakdown voltage in the concentric circles, the breakdown voltage which is sufficient to protect the MOSFET between the gate and the source is secured.

According to this embodiment, the pn junction diodes 121 to 124 having the same configurations are connected in parallel. In other words, if a pn junction area S2 in the pn junction diode 121 is the same as a pn junction area S1 within the innermost periphery of the protection diode 43d in the concentric circles in FIG. 7, the protection diode 12d obtains the same breakdown voltage as that of the protection diode 43d with the concentric-circular shape.

The pn junction diodes 12a and 12b with the stripe shapes are formed in the same pattern as that of the gate electrode 13. In other words, for example, the ten pn junction diodes 12a and 12b with the stripe shapes can actually be disposed below the gate pad electrode 18. Accordingly, by connecting these diodes in parallel, the pn junction area S2 having the same breakdown voltage as the pn junction area S1 within the innermost periphery of the protection diode with the concentric-circular shape is sufficiently secured.

Furthermore, by series-connecting the same number of the pn junctions in the pn junction diode 121 as that of the series connections of the pn junctions in the protection diode 43d with the concentric-circular shape, the same breakdown voltage as that of the protection diode 43 with the concentric-circular shape is obtained.

Suppose a case where lengths Lp and Ln of the corresponding p type semiconductor region 12p and n type semiconductor region 12n according to this embodiment are respectively the same as lengths Lp' and Ln' in the protection diode 43d with the concentric-circular shape. In this case, when the numbers of the series connections of the pn junctions are the same between the pn junction diode 121 and the protection diode 43d, the diameter of the protection diode 43d with the concentric-circular shape is the same as the length of the single pn junction diode 12a with the stripe shape.

Accordingly, the area occupied by the protection diode 12d according to this embodiment is made smaller than that of the protection diode 43d with the concentric-circular shape.

As described above, according to this embodiment, the breakdown voltage of the protection diode 12d is determined by the number of the series connections of the pn junctions in the pn junction diode 121 (positions of the contact holes CH for the source electrode 17 and the gate pad electrode 18).

Still furthermore, the current capacity of the protection diode 12d is determined by the number of the parallel connections (four in this embodiment) in the pn junction diode 121.

For this reason, the number of the series connections of the pn junctions (position of the contact hole CH for each electrode) and the number of the parallel connections are appropriately selected in accordance with the property of the protection diode 12*d*.

Figure 8:
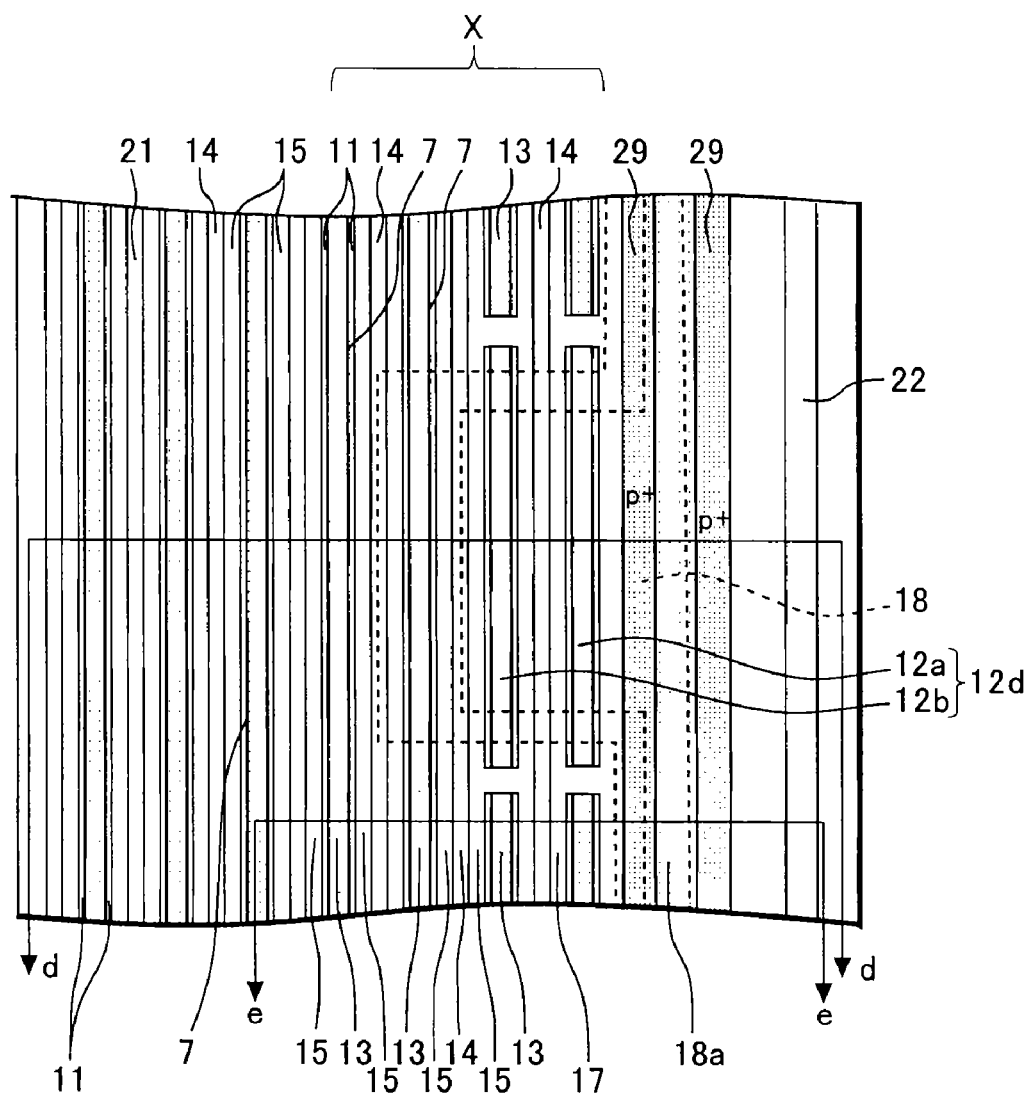
FIG. 8 is a plan view for describing another semiconductor device according to a second embodiment of the present invention.
Figure 9:
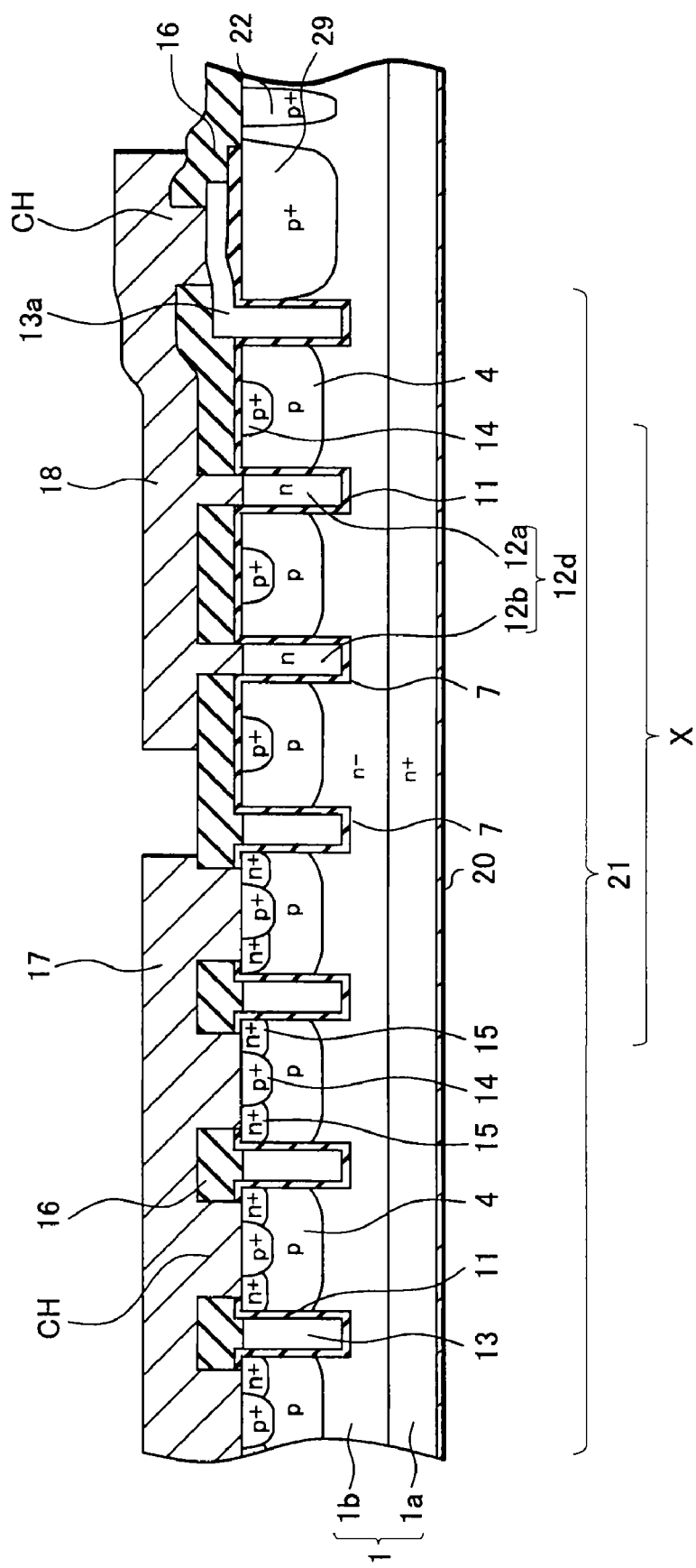
FIG. 9 is a cross-sectional view for describing the semiconductor device according to the second embodiment of the present invention.
Figure 10:
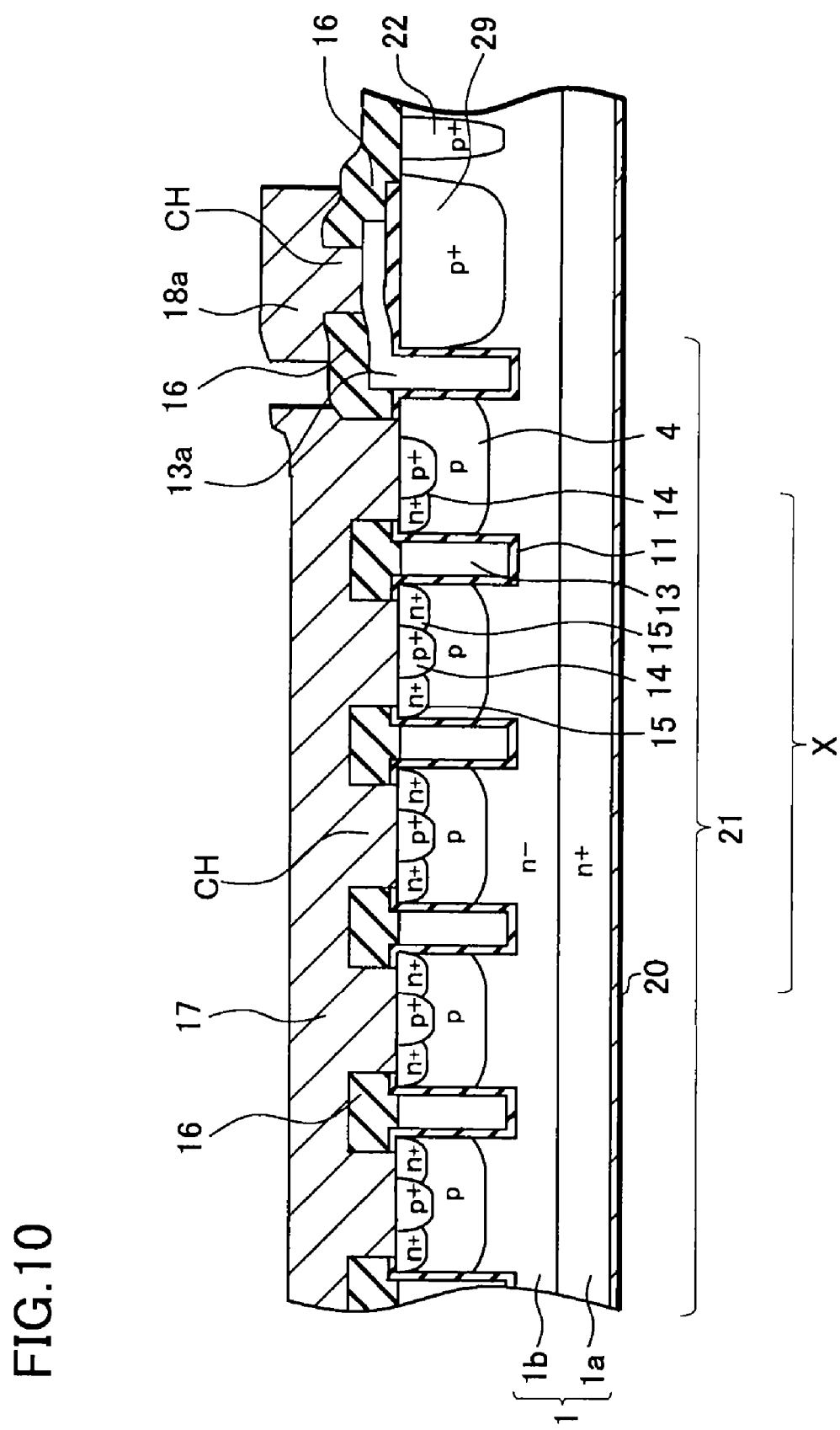
FIG. 10 is a cross-sectional view for describing the semiconductor device according to the second embodiment of the present invention.

FIG. 8 to FIG. 10 shows the second embodiment according to the present invention. FIG. 8 is a partially enlarged view for describing transistor cells. The transistor cell according to the second embodiment has a trench structure, and the other configurations are the same as those in FIG. 1. For this reason, a chip of a MOSFETs 100 is referred to the plan view of FIG. 1, and description for the same constituents is omitted.

FIG. 8 is a plan view of metal electrode layers indicated by the dashed lines, and in which interlayer insulating films are omitted. FIG. 9 is a cross-sectional view taken along the line d-d in FIG. 8. FIG. 10 is a cross-sectional view taken along the line e-e in FIG. 8.

The first embodiment is so-called the MOSFET in which the gate electrodes are in the planar structure with the vertical current paths. Meanwhile, the second embodiment is the MOSFET in a trench structure.

As shown in FIG. 8, trenches 7 are formed in a stripe shape in a plane pattern of an n type semiconductor substrate 1. In the plane pattern, gate electrodes 13, channel regions 4, source regions 15 and body regions 14 are all formed in stripe shapes along the trenches 7.

In this case also, the transistor cells are stripe-shaped. The channel regions 4 and body regions 14 which are connected to the transistor cells are formed below a gate pad electrode 18. The patterns of a source electrode 17 and a gate wiring 18*a* are the same as those according to the first embodiment.

As shown in FIG. 9, the trenches 7 penetrate through the channel regions 4, and have the depth reaching an n− type semiconductor layer 1*b*. In this case, the channel regions 4 are continuously formed in the surface of the n type semiconductor substrate 1. The inner wall of the trench 7 is covered with a gate oxide film 11, and the trench 7 is filled with a polysilicon filling.

Below the source electrode 17, the resistance in the polysilicon in the trench 7 is to be reduced, and then the gate electrode 13 is formed. The n+ type source regions 15 are formed in the surface of the channel region 4 which is adjacent to the trenches 7. The p+ type body region 14 is formed between the adjacent source regions 15 in the surface of the channel region 4.

The interlayer insulating films 16 are formed, covering the gate electrodes 13. The source electrode 17 is in contact with the source regions 15 and the body regions 14 (the channel region 4) via contact holes CH formed in the interlayer insulating films 16.

The trenches 7, the polysilicon, the body regions 14 and the channel regions 4 are disposed in the n type semiconductor substrate 1 below the gate pad electrode 18, but the gate pad electrode 18 is never in contact with the channel regions 4.

The gate pad electrode 18 is in contact with a gate leading electrode 13*a* above a p+ type impurity region 29 via the contact holes CH formed in the interlayer insulating films 16.

The transistor cells in an X region is in contact with the source electrode 17 which surrounds the gate pad electrode 18, and which is adjacent thereto. Accordingly, the electric potential of these electrodes are fixed, and thereby the transistor operation is performed.

Moreover, the channel regions 4 below the gate pad electrode 18 are fixed to the source potential. The reverse breakdown voltage between the drain and the source equal to that of an operation region 21 is secured.

Pn junction diodes 12*a* and 12*b* with stripe shapes, with which polysilicon are buried in the trenches, are disposed below the gate pad electrode 18. One of each pn junction diodes 12*a* and 12*b* is connected to the gate pad electrode 18, and the other end is connected to the source region 17, and thereby a protection diode 12*d* between the gate and the source is formed.

According to the second embodiment, the insulating film 11 is formed in the trench 7. However, the description thereof is omitted, since the schematic plan view showing the connection between the protection diode 12*d* and each electrode is the same as FIG. 4 and FIG. 5.

The polysilicon are buried in the trenches 7 with the stripe shape in the flat pattern. In the X region, the polysilicon and the gate electrodes 13 formed in the extending direction of the polysilicon are insulated by dividing the trenches 7.

As in the plane patterns in FIG. 4 and FIG. 5, n type semiconductor regions 12*n* and *p* type semiconductor regions 12*p* are alternately disposed adjacent to one another in the polysilicon in the trench 7. Then, the implantation and/or the deposition of impurities are performed so as to form pn junctions.

Accordingly, four pn junction diodes 121 to 124 which are connected to the source electrode 17 and the gate pad electrode 18 at both ends, are connected to one another in parallel, and thereby the single protection diode 12*d* is formed. The protection diode 12*d* is connected between the source and the gate of the MOSFET.

According to the second embodiment, the gate electrode 13 has the trench structure. Thus, the number of the transistor cells disposed in the operation region 21 is increased as compared to the first embodiment, resulting in the increase of the cell density.

Additionally, the embodiments according to the present invention have been described by use of the n channel MOSFET. However, the same effect is obtained in a p channel MOSFET in which the conductivity type is made opposite to those embodiments, or an IGBT (Insulated Gate Bipolar Transistor) in which a p type (n type) substrate is disposed below an n+ (p+) type semiconductor substrate of a MOSFET, as well.

According to the present invention, provided is the MOSFET in which a high reverse breakdown voltage between the drain and the source is secured without reducing the area of the operation region. Specifically, the transistor cells are formed in the stripe shape. Some of the channel regions are disposed below the gate pad electrode, and thereby the source potential is applied to the channel regions. The channel regions below the gate pad electrode are formed in the same pattern as that of the operation region of the MOSFET. Thus, the reverse breakdown voltage between the drain and the source equal to that of the operation region is secured even below the gate pad electrode.

For this reason, even when the reverse breakdown voltage between the drain and the source is modified, a predetermined breakdown voltage is secured without modifying the pattern (curvature at the corner) of the p+ type impurity region which was necessity conventionally. For example, when higher breakdown voltage is secured, conventionally there has been a problem that the operation region (the number of the areas for disposing the transistor cells) has to be reduced in accordance with the modification of the pattern of the p+ type impurity region. In contrast, according to the present embodiments, the reverse breakdown voltage between the drain and the source is secured in the channel regions below the gate pad electrode, instead of the conventional p+ type impurity region having a large area. In addition, the area for the operation region is secured as that of the conventional operation region.

Moreover, the pn junction diode with the stripe shape is formed below the gate pad electrode. The gate potential is applied to the one end of the pn junction diode, and the source potential is applied to the other end of the pn junction diode. According to the present embodiments, the polysilicon is disposed in the stripe shape below the gate pad electrode. Utilizing this structure, the protection diode is disposed below the gate pad electrode.

Furthermore, the breakdown voltage of the protection diode can be arbitrarily set by appropriately selecting the positions of the contact holes for the gate pad electrode, the source electrode, and the pn junction diodes with the stripe shape.

What is claimed is:

1. An insulated-gate semiconductor device comprising:
a semiconductor substrate of a first general conductivity type;
a plurality of gate electrodes formed on or in a surface portion of the semiconductor substrate in a form of stripes running in a first direction;
a plurality of channel regions of a second general conductivity type formed in the surface portion in a form of stripes running in the first direction;
a first insulating film formed between one of the plurality of gate electrodes and a corresponding one of the plurality of channel regions;
a plurality of source regions of the first general conductivity type formed in the plurality of channel regions in a form of stripes running in the first direction;
a gate pad electrode formed on the surface portion;
a plurality of pn junction diodes formed on or in the surface portion so as to be under the gate pad electrode and extend in the first direction, each of the plurality of pn junction diodes comprising a plurality of pn junctions serially connected;
a second insulating film formed on each of the plurality of gate electrodes, on the plurality of pn junction diodes and on portions of the plurality of channel regions, and
a source electrode formed on the surface portion so that the source electrode is disposed on the plurality of source regions and is electrically in contact with the plurality of source regions through contact holes formed in the second insulating film,
wherein the gate pad electrode is disposed on portions of a set of the plurality of channel regions so that other portions of the set of the plurality of channel regions extend from under the gate pad electrode and the source electrode is physically in contact with the other portions of the set of the plurality of channel regions extending from under the gate pad electrode, the plurality of channel regions in the set being continuous under the gate pad electrode.

2. The insulated-gate semiconductor device of claim 1, further comprising a gate leading electrode formed on a peripheral portion of the semiconductor substrate and extending from the gate pad electrode so as to be electrically connected to the plurality of gate electrodes, and a high concentration region of the second general conductivity type formed in the surface portion under the gate leading electrode so as to be electrically connected to the plurality of channel regions.

3. The insulated-gate semiconductor device of claim 1, wherein the portions of the plurality of channel regions under the gate pad electrode are electrically connected to the source electrode.

4. The insulated-gate semiconductor device of claim 1, wherein each of the plurality of pn junction diodes is configured to receive at one end thereof a potential that is applied to the plurality of gate electrodes and to receive at another end thereof a potential that is applied to the plurality of source regions.

5. The insulated-gate semiconductor device of claim 1, wherein the plurality of pn junction diodes are connected to each other in parallel to form a protection device connected between one of the plurality of gate electrode and the source electrode.

6. The insulated-gate semiconductor device of claim 1, wherein a width of the plurality of pn junction diodes is equal to a width of the plurality of gate electrodes.

7. The insulated-gate semiconductor device of claim 1, wherein none of the plurality of source regions are formed in the portions of the plurality of channel regions disposed under the gate pad electrode.

8. The insulated-gate semiconductor device of claim 1, wherein the plurality of pn junction diodes are formed in a form of stripes running in the first direction, and the plurality of pn junctions of the plurality of pn junction diodes run perpendicular to the first direction.

* * * * *